(12) United States Patent
Lai et al.

(10) Patent No.: US 9,569,578 B1
(45) Date of Patent: Feb. 14, 2017

(54) MASK DECOMPOSITION AND OPTIMIZATION FOR DIRECTED SELF ASSEMBLY

(71) Applicant: International Business Machines Corporation, Armonk, NY (US)

(72) Inventors: Kafai Lai, Poughkeepsie, NY (US); Rasit O. Topaloglu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/967,877

(22) Filed: Dec. 14, 2015

(51) Int. Cl.
*G06F 17/50* (2006.01)
*H01L 21/027* (2006.01)
*H01L 21/3105* (2006.01)
*H01L 21/311* (2006.01)

(52) U.S. Cl.
CPC ....... *G06F 17/5068* (2013.01); *H01L 21/0274* (2013.01); *H01L 21/31058* (2013.01); *H01L 21/31133* (2013.01)

(58) Field of Classification Search
CPC .............. G06F 17/5072; G06F 17/5068; G06F 17/5081; G06F 17/5045; G06F 2217/08; G06F 17/2247; G06F 17/505; G06F 2217/12; G06T 2207/20072
USPC ..................................... 716/50–55; 430/5, 30
See application file for complete search history.

(56) References Cited

U.S. PATENT DOCUMENTS

| | | | |
|---|---|---|---|
| 8,108,804 B2 | 1/2012 | Graur et al. | |
| 8,114,306 B2 | 2/2012 | Cheng et al. | |
| 8,156,450 B2 | 4/2012 | Chan et al. | |
| 8,336,003 B2 | 12/2012 | Cheng et al. | |
| 8,584,060 B1 | 11/2013 | Brearley et al. | |
| 8,650,511 B2 | 2/2014 | Lu et al. | |
| 8,656,322 B1 | 2/2014 | Dechene et al. | |
| 8,689,151 B1 * | 4/2014 | Agarwal | G03F 7/70466 716/50 |
| 8,856,693 B2 | 10/2014 | Cheng et al. | |
| 8,954,900 B1 | 2/2015 | Ho et al. | |
| 9,009,634 B2 | 4/2015 | Latypov et al. | |
| 9,058,996 B2 | 6/2015 | Maeda et al. | |
| 2010/0209106 A1 * | 8/2010 | Sugawara | H04B 10/275 398/59 |
| 2010/0294740 A1 | 11/2010 | Cheng et al. | |
| 2015/0242555 A1 | 8/2015 | Wang et al. | |
| 2015/0242558 A1 | 8/2015 | Amit et al. | |

* cited by examiner

*Primary Examiner* — Nghia Doan
(74) *Attorney, Agent, or Firm* — Law Offices of Ira D. Blecker, P.C.

(57) ABSTRACT

A computer implemented method of mask decomposition and optimization for directed self assembly (DSA) which includes: inputting design information of an integrated circuit that is to be patterned using a DSA process; mapping the design information into a tree graph comprising nodes and edges; searching the tree graph to identify a longest path through the tree graph; identifying a branch comprising an edge on the tree graph not on the longest path and stemming from one of the nodes on the longest path; outputting the one node on the longest path that connects to the branch as a hot spot; and modifying a photomask by removing the branch from the photomask; wherein the method is performed by one or more computing devices.

14 Claims, 6 Drawing Sheets

US 9,569,578 B1

MASK DECOMPOSITION AND OPTIMIZATION FOR DIRECTED SELF ASSEMBLY

BACKGROUND

The present exemplary embodiments pertain to methods for fabricating integrated circuits, and more particularly pertain to methods for fabricating integrated circuits including generating modified photomasks for directed self-assembly.

Directed self-assembly (DSA), a technique that aligns self-assembling polymeric materials on a lithographically defined directing or guide pattern, is a potential option for extending current lithography beyond its pitch and resolution limits. The self-assembling materials, for example, are block copolymers (BCPs) that consist of an "A" homopolymer covalently attached to a "B" homopolymer, which are deposited over a lithographically defined directing pattern on a semiconductor substrate. The lithographically defined directing pattern is a pre-pattern (hereinafter "DSA directing pattern") that is encoded with spatial chemical and/or topographical information (e.g., chemical epitaxy and/or graphoepitaxy) and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the underlying DSA directing pattern to define a nanopattern. Then, by removing either the A polymer block or the B polymer block by wet chemical or plasma-etch techniques, a DSA pattern is formed. The DSA pattern may be used as a mask for transferring the DSA pattern to the underlying semiconductor substrate.

BRIEF SUMMARY

The various advantages and purposes of the exemplary embodiments as described above and hereafter are achieved by providing, according to a first aspect of the exemplary embodiments, a computer implemented method of mask decomposition and optimization for directed self assembly (DSA) comprising: inputting design information of an integrated circuit that is to be patterned using a DSA process; mapping the design information into a tree graph comprising nodes and edges; searching the tree graph to identify a longest path through the tree graph; identifying a branch comprising an edge on the tree graph not on the longest path and stemming from one of the nodes on the longest path; outputting the one node on the longest path that connects to the branch as a hot spot; and modifying a photomask by removing the branch from the photomask at the hot spot.

According to a second aspect of the exemplary embodiments, there is provided a computer program product for mask decomposition and optimization for directed self assembly (DSA), the computer program product comprising a computer readable storage medium having program instructions executable by a computer processing device to cause the computer processing device to perform a method comprising: inputting design information of an integrated circuit that is to be patterned using a DSA process; mapping the design information into a tree graph comprising nodes and edges; searching the tree graph to identify a longest path through the tree graph; identifying a branch comprising an edge on the tree graph not on the longest path and stemming from one of the nodes on the longest path; outputting the one node on the longest path that connects to the branch as a hot spot; modifying a photomask by removing the branch from the photomask at the hot spot.

According to a third aspect of the exemplary embodiments, there is provided an apparatus for mask decomposition and optimization for directed self assembly (DSA) comprising: a central processing unit: a storage; a design information of an integrated circuit that is to be patterned using a DSA process stored in the storage; a DSA mask converter system stored in the storage the central processing unit programmed with the DSA mask converter system to perform a method comprising: inputting design information of an integrated circuit that is to be patterned using a DSA process; mapping the design information into a tree graph comprising nodes and edges; searching the tree graph to identify a longest path through the tree graph; identifying a branch comprising an edge on the tree graph not on the longest path and stemming from one of the nodes on the longest path; outputting the one node on the longest path that connects to the branch as a hot spot; and modifying a photomask by removing the branch from the photomask at the hot spot.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

A typical DSA process may involve fabrication of a patterned photomask to be used to make the DSA directing pattern, exposing this photomask in a lithographic tool to photoresist that is disposed on a semiconductor substrate, developing and etching the exposed photoresist on the semiconductor substrate, processing the semiconductor substrate to create the DSA directing pattern from the photoresist, spin coating the pre-patterned semiconductor substrate with a BCP, and annealing and etching the BCP to form the DSA pattern.

Figure 1A:
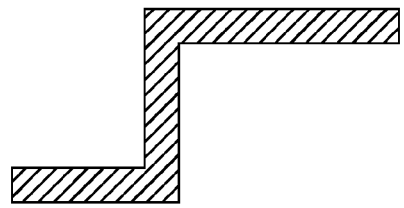
FIGS. 1A and 1B are illustrations of types of line and via configurations that DSA can support.
Figure 1B:
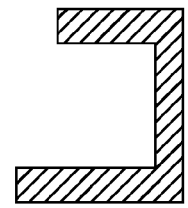

A concern with DSA is that DSA can only support certain types of line (also called interconnects) and via configurations. In particular, DSA cannot support tree-like line and via configurations. Referring to FIGS. 1A and 1B, there are two types of via and line configurations that DSA may support and are manufacturable. It is noted that the configurations shown in FIGS. 1A and 1B represent a continuous path without branching.

Figure 2A:
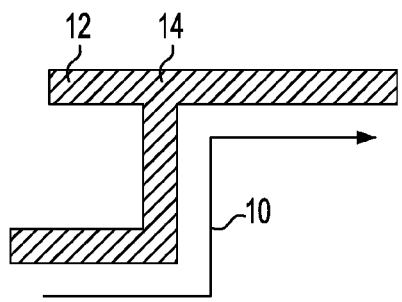
FIGS. 2A, 2B and 2C are illustrations of line and via configurations that DSA cannot support.
Figure 2B:
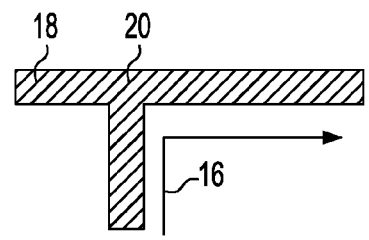
Figure 2C:
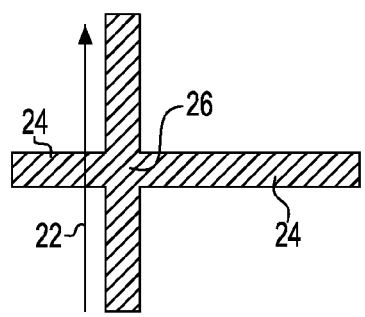

FIGS. 2A, 2B and 2C illustrate tree-like line and via configurations that DSA may not support and may not be manufacturable because the graphoepitaxy process may result in opens or breaks at meet points. In FIG. 2A, one continuous path is indicated at 10. Line/via branch 12 may not be supported by DSA and the mask pattern may break 14 at the branch 12. FIG. 2B is another line/via configuration in which one continuous path 16 has a branch 18. The mask pattern may break 20 at the branch 18. FIG. 2C may be another type of line/via configuration that may not be supported by DSA. In FIG. 2C, one continuous path 22 may have two branches 24. The mask pattern may break 26 at the branches 24.

In the following discussion, the line and via configurations are collectively referred to as "design patterns". Where the exemplary embodiments refer to just lines or just vias, "lines" or "via" may be referred to instead of "design patterns". Via patterns may contain a series of circular, square, oval, or rectangular vias even though only the confining box or prepattern is shown.

The design patterns shown in FIGS. 2A, 2B and 2C may be modified according to the exemplary embodiments so that they be manufacturable by a DSA process. In one exemplary embodiment, DSA-unfriendly portions of the design patterns may be identified and optimized.

In another exemplary embodiment, a single DSA design pattern may be broken up into two or more DSA design patterns. A decomposition methodology is needed to break up the single design pattern. The decomposition methodology of the exemplary embodiments is distinguishable from the standard double patterning schemes such as litho-etch-litho-etch in that the DSA decomposition methodology is limited by the graphoepitaxy of DSA. DSA has more limitations as to what type of patterns may be manufactured. Hence, decomposition algorithms suitable for standard double patterning schemes litho-etch-litho-etch or self-aligned double patterning and their derivatives do not work for DSA.

Given design layout or mask information for the design patterns, the present exemplary embodiments propose a method and system that may identify which portions of the design patterns are not DSA-friendly, outputs a report showing the locations of such portions and optimizes the layout of such portions. The exemplary embodiments also propose a method and system that provides a decomposition solution if multiple DSA steps have to be used.

Figure 3:
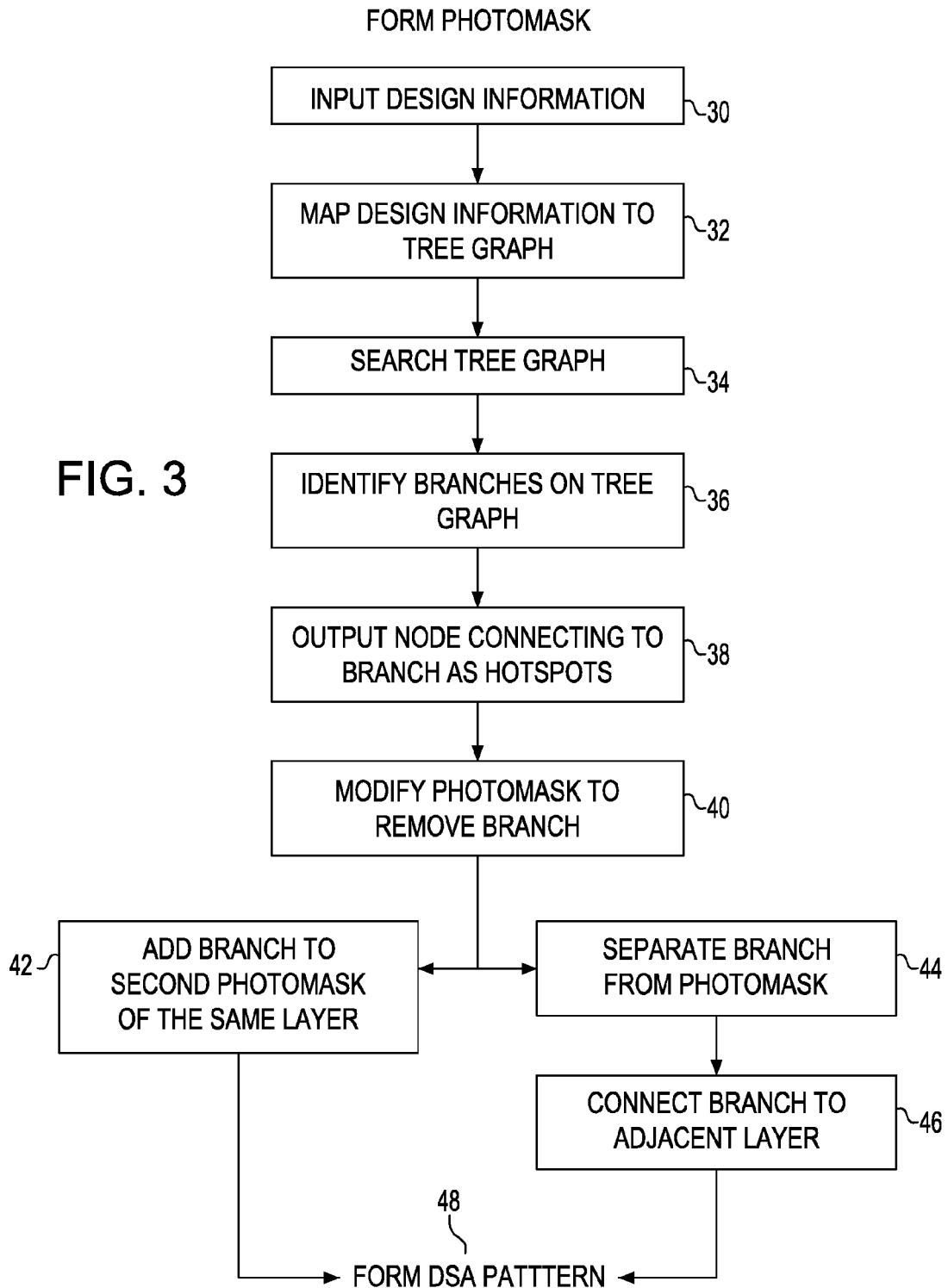
FIG. 3 is a flow chart for practicing the exemplary embodiments.

Referring now to FIG. 3, there is illustrated a flow chart of the exemplary embodiments. In a first step, box 30, design information of an integrated circuit that is to be patterned using a DSA process is input into a mask design system. This design information may be the integrated circuit design layout or mask data.

Figure 4A:
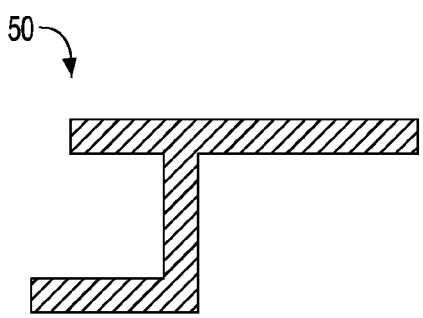
FIG. 4A is an illustration of the line and via configuration of FIG. 2A
Figure 4B:
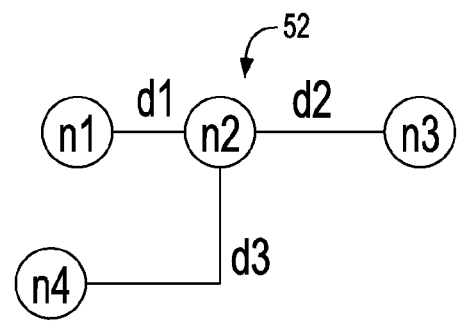
FIG. 4B is a tree graph of the line and via configuration of FIG. 2A.

This design information is mapped into a tree graph, box 32. Referring now to FIG. 4A, there is illustrated the design pattern previously shown in FIG. 2A. As presently shown, the design pattern 50 in FIG. 4A may not be manufacturable by a DSA process because of its tree-like design pattern. The design pattern 50 of FIG. 4A is now mapped into a tree graph 52 as shown in FIG. 4B. In computer science, a tree graph is a widely used abstract data type or data structure implementing this abstract data structure that simulates a hierarchical tree structure, with a root value and subtrees of children with a parent node, represented as a set of linked nodes. The tree graph 52 is essentially a representation of the design pattern 50 in the form of a tree graph and comprises nodes n1, n2, n3, n4 linked by edges d1, d2 and d3.

In tree graph 52, the nodes are where two lines or interconnects may meet. There may or may not be vias at the nodes. The edges may be interconnects and may also be vias or via arrays. Nodes may also be added to an end of each interconnect so that an edge may be drawn to another node.

The tree graph 52 may be searched to identify the longest path through the tree graph, box 34. The tree graph search may be done by depth first searching. A depth-first search is an algorithm for traversing or searching tree graph data structures. One starts at the root (selecting some arbitrary node as the root in the case of a graph) and explores as far as possible along each branch before backtracking. Preferably, two depth first searches are used to find the longest path. Other algorithms, such as those based on heuristics, may also be used. In tree graph 52, there are three possible paths. One path may be edges d3-d2, a second path may be edges d3-d1 and a third path may be edges d1-d2. The longest path appears to be the first one, edges d3-d2 and is identified as the longest path.

In the next step, box 36, the branches on the tree graph 52 stemming from the longest path are identified. For the longest path selected, edges d3-d2, then the path of edge d1 is a branch.

The branches previously identified indicate where a disconnection may occur. The node on the longest path where a disconnection (i.e., an open or break) may occur is output as a hot spot by the mask design system, box 38.

The processes of mapping the tree graph, identifying the branches on the tree graph and outputting the nodes as hotspots may be described in more detail. Each design pattern may be mapped into an edge and a node in a graph layout. The result is the tree graph 52 shown in FIG. 4B. Then, two depth first searches on the tree graph 52 reveals edges d3-d2 as the longest path. The nodes on the longest path, i.e., n4, n2, n3, are recorded. Nodes are found that are connected to the longest path but are not on the longest path. That is, node n1 is connected to node n2 on the longest path but nodes n1 is not on the longest path. The edge connecting from the longest path to such a node n1, i.e. edge d1, is identified. The coordinates of nodes on the longest path touching edge d1, i.e. node n2, are printed out to indicate DSA grapho-epitaxy weak/break points or hotspots. In this case, node n2 may be outputted as the hotspot.

It should be understood that while, for purposes of illustration and not limitation, only one tree graph, one branch and one hotspot are shown in FIG. 4B, it should be understood that for an integrated circuit design there may be, and usually are, multiple tree graphs and multiple branches and hotspots possible for each tree graph in the integrated circuit design.

Thereafter, the photomask may be modified by removing the branch from the photomask extending from the hot spot, box 40. For example, in the example above, node n2 is the hotspot and edge d1 is the branch extending from the hotspot. The photomask may be modified by removing the branch (edge d1) connecting to the hot spot (node n2).

Figure 5:
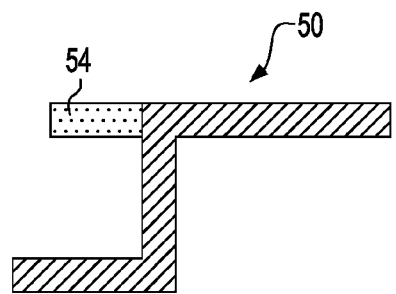
FIG. 5 is an illustration of the line and via configuration of FIG. 2A with a branch of the line and via configuration being removed to a second photomask in an example of mask decomposition.

The branches may be removed from the photomask in one of two ways. The first embodiment follows the left branch of FIG. 3. Referring now to FIG. 5, there is shown the design pattern 50 of FIGS. 2A and 4A with the branch 54 indicated. In this embodiment, box 42 of FIG. 3, the branch 54, i.e., edge d1 of the tree graph 52, connecting from the longest path to node n1 may be moved to a second photomask of the same layer by a DSA mask decomposer.

The second embodiment follows the right branch of FIG. 3. In this second embodiment, the branches are separated from the longest path, box 44, and then are connected to an adjacent layer, box 46.

Figure 6A:
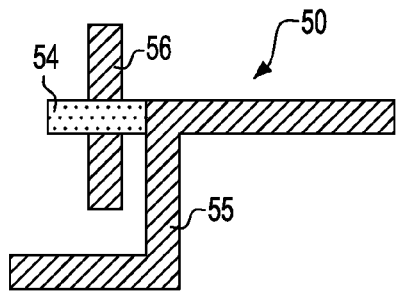
FIGS. 6A, 6B and 6C is an illustration of the line and via configuration of FIG. 2A which has undergone one type of a mask optimizer process to make the line and via configuration supportable by DSA.
Figure 6B:
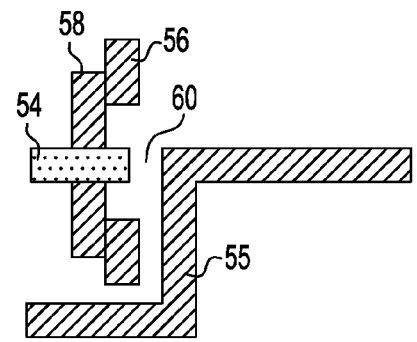
Figure 6C:
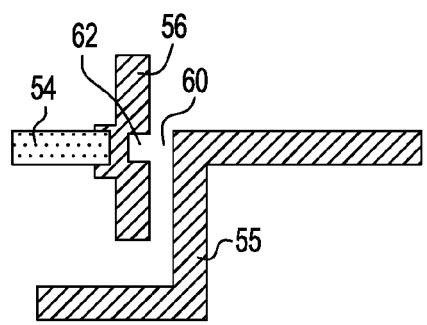

This second embodiment may be accomplished in several ways. One way of accomplishing the first embodiment is shown in FIGS. 6A, 6B and 6C. FIGS. 6A, 6B and 6C may apply only to an embodiment where a via or a via array are to be disconnected from the longest path of a via array, shown in FIGS. 6A, 6B and 6C as drawn line 55. Referring first to FIG. 6A, there is shown the design pattern 50 of FIGS. 2A and 4A with the branch 54 indicated again with the exception that branch 54 and drawn line 55 may only apply to vias. In an adjacent layer, there is an existing interconnect 56 that is currently connected to branch 54. Through a DSA mask optimizer, the branch 54 is pushed away from the longest path 55 to create a gap 60. Simultaneously, a new interconnect 58 may be added in the adjacent layer and is also pushed away from its original position so as to maintain contact with branch 54 and interconnect 56. Interconnect 56 may not change its original position. In an alternative embodiment illustrated in FIG. 6C, a notch 62 may be added to interconnect 56 to accommodate the movement of branch 54; otherwise, interconnect 56 may not need to move.

After the modifications to the design patterns of FIGS. 6B and 6C, the edge d1 in the tree graph of FIG. 4B is gone and the wiring configuration of design pattern 50 has been changed.

Figure 7A:
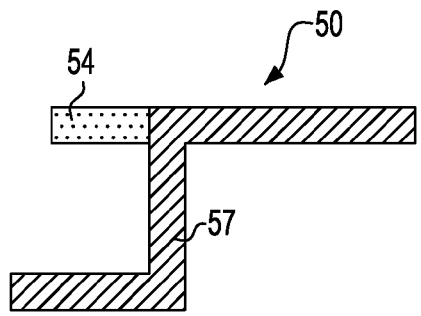
FIGS. 7A, 7B and 7C is an illustration of the line and via configuration of FIG. 2A which has undergone a second type of a mask optimizer process to make the line and via configuration supportable by DSA.
Figure 7B:
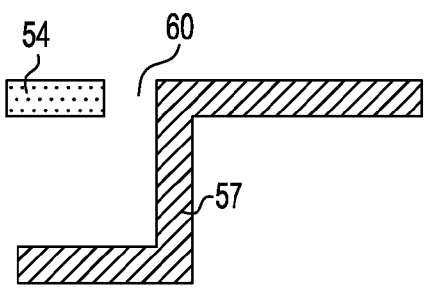
Figure 7C:
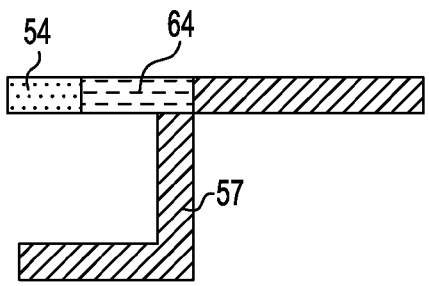

Another way of accomplishing the second embodiment is shown in FIGS. 7A, 7B and 7C. Referring first to FIG. 7A, there is shown the design pattern 50 of FIGS. 2A and 4A with the branch 54 indicated. In the embodiment of FIGS. 7A, 7B and 7C, the branch 54 and the longest path, shown as drawn line 57, may only represent interconnects. Through a DSA mask optimizer, the branch 54 may be pushed away from the longest path 57 to create a gap 60 as shown in FIG. 7B. Thereafter, an interconnect 64 in an adjacent layer, with vias (not shown) on both ends of the interconnect 64 connecting the interconnect 64 to the branch 54 and the longest path 57, may be added to branch 54 to reconnect branch 54 with the longest path 57 as shown in FIG. 7C.

In the embodiment illustrated in FIGS. 7A, 7B and 7C, the process has become more manufacturable.

Figure 8:
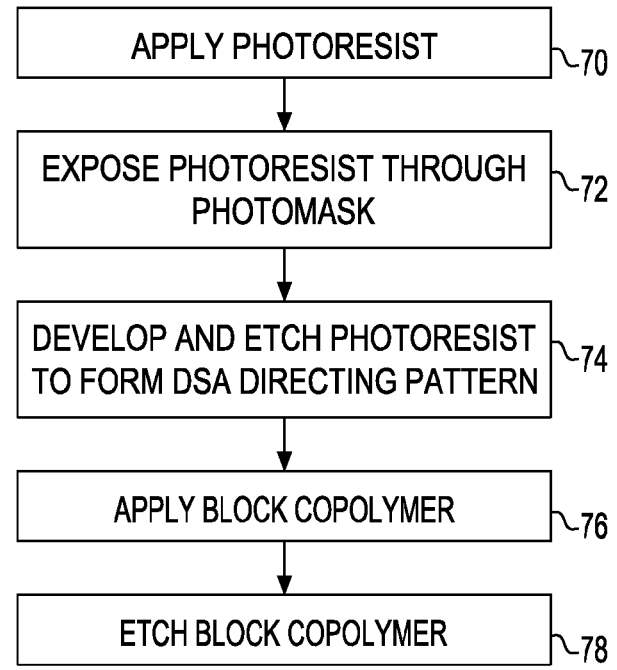
FIG. 8 is a flow chart of a process to form a DSA pattern using the photomask of the processes of FIG. 3.

Referring back to FIG. 3, the process next proceeds to form a DSA pattern 48 as described with respect to FIGS. 8 and 9. As shown in FIG. 8, box 70, and FIG. 9A, photoresist 82 is applied to an integrated circuit substrate 80.

Figure 9A:
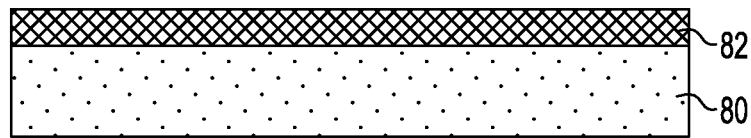
FIGS. 9A to 9E are illustrations of the physical steps to implement the processes of FIG. 8.
Figure 9B:
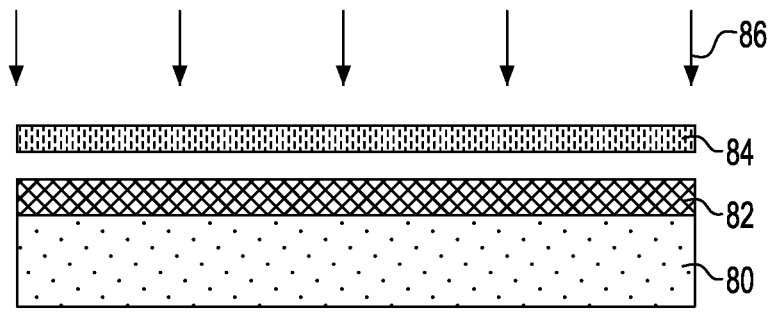

Thereafter, as shown in FIG. 8, box 72, and FIG. 9B, a photomask 84 is placed in proximity to the photoresist 82 and exposed to suitable radiation 86 in a conventional lithographic process.

Figure 9C:
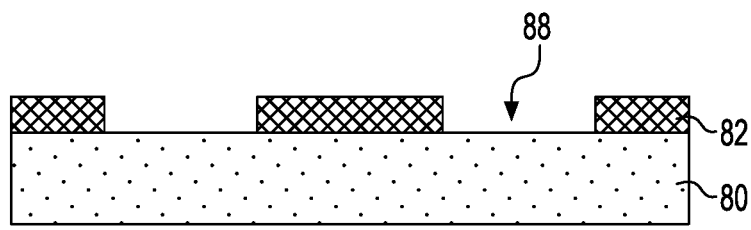

Then, in FIG. 8, box 74, and FIG. 9C, the photoresist 82 is developed and etched to form a DSA directing pattern, 88.

Figure 9D:
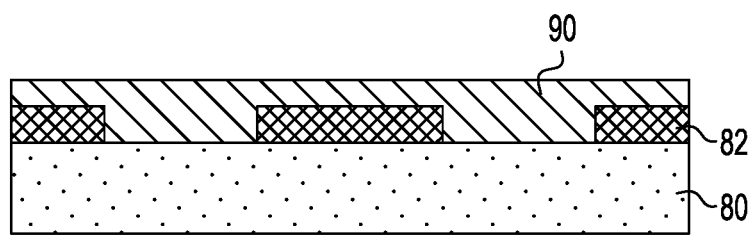

In a next process according to FIG. 8, box 76, and FIG. 9D, a conventional block copolymer 90 used for DSA may be applied.

Figure 9E:
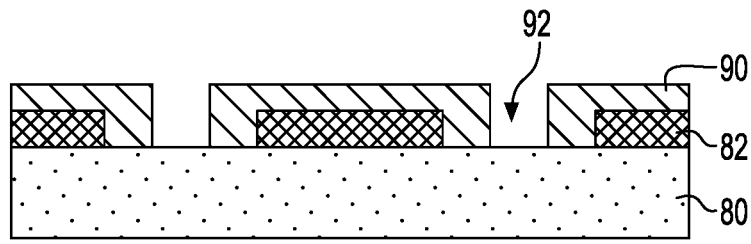

The copolymer may be annealed if required and then the copolymer is etched to form the DSA pattern 92 as shown in FIG. 9E and FIG. 8, box 78. Thereafter, the integrated circuit substrate 80 may be etched through the DSA pattern 92.

Figure 10:
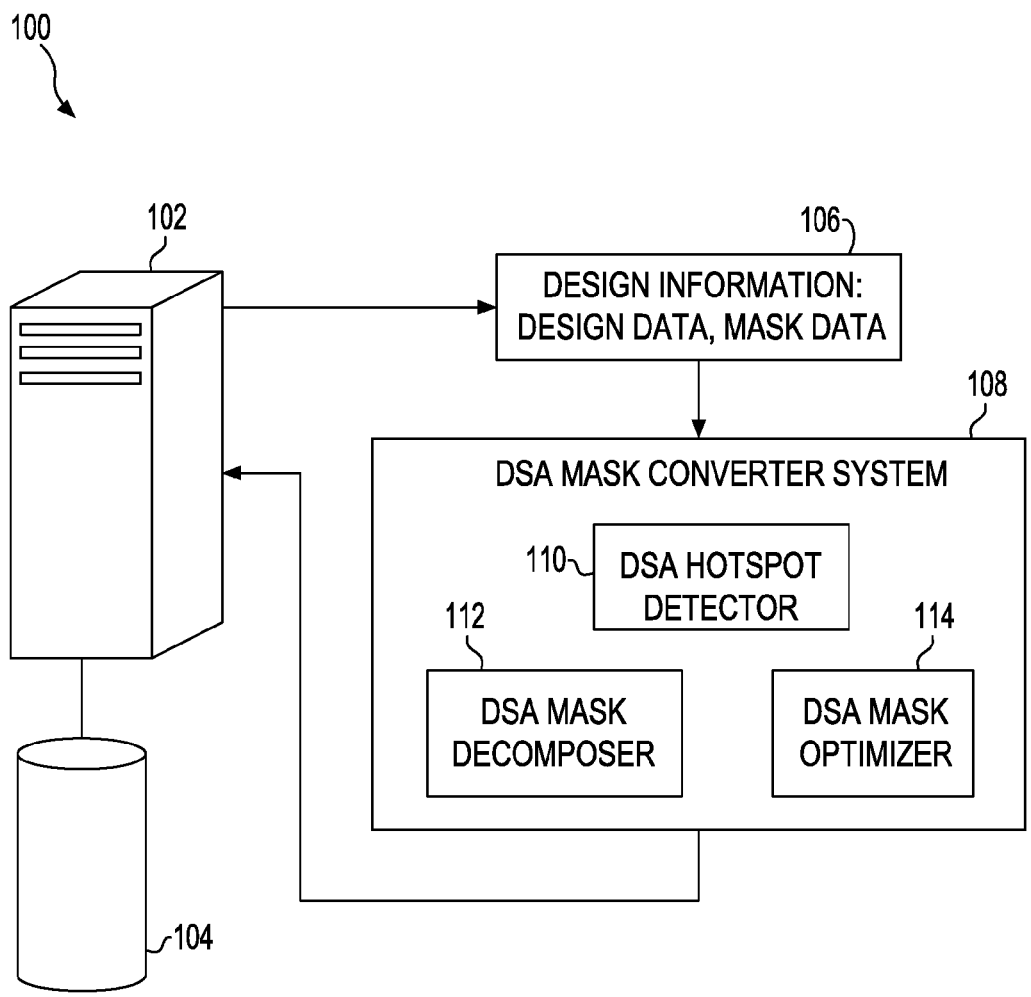
FIG. 10 is an illustration of a mask design system according to the exemplary embodiments.

An exemplary embodiment of a mask design system 100 is illustrated in FIG. 10. The mask design system 100 may include a host computing device 102. For purposes of illustration and not limitation, the host computing device 102, for example, may be a desktop computer, laptop computer or mainframe computer. The host computing device 102 may have storage 104. The storage 104 may be internal or external to the host computing device 102. If the storage 104 is external to the host computing device 102, the storage 104 may be locally connected to the host computing device 102 or may be remote from the host computing device 102.

The host computing device 102 or storage 104 may have design information 106 of an integrated circuit. This design information 106 may be in the form of design data of the integrated circuit or it may be mask data.

The design information 106 may be inputted to a DSA mask converter system 108 which reviews the design information 106 and modifies the photomasks to correct any design patterns that may make the design patterns not manufacturable in a DSA process. The DSA mask converter system 108 may include a DSA hot spot detector 110 to review the design patterns and determine if any of the design patterns have hotspots, as described earlier.

The DSA mask converter system 108 may further include a DSA mask decomposer 112 to decompose the photomasks to separate design patterns that may be patterned using a second photomask as described earlier with respect to FIG. 5.

Lastly, the DSA mask converter system 108 may include a DSA mask optimizer 114 to optimize the photomasks to modify design patterns that may ordinarily not be manufacturable in a DSA process as described earlier with respect to FIGS. 6A to 6C and FIGS. 7A to 7C.

The present exemplary embodiments may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A computer implemented method of mask decomposition and optimization for directed self assembly (DSA) comprising:

inputting design information of an integrated circuit that is to be patterned using a DSA process;

mapping the design information into a tree graph comprising nodes and edges;

searching the tree graph using a tree graph searching algorithm to identify a longest path through the tree graph;

identifying a branch comprising an edge on the tree graph not on the longest path and stemming from one of the nodes on the longest path;

outputting the one node on the longest path that connects to the branch as a hot spot;

modifying a photomask by removing the branch from the photomask at the hot spot wherein removing the branch comprising separating the branch from the longest path and connecting the removed branch to a via, via array or line on an adjacent layer or a same layer; and further comprising applying a photoresist layer on a substrate of an integrated circuit;

exposing the photoresist layer to the modified photomask in a lithographic process;

developing and etching the exposed photoresist layer to form a DSA directing pattern;

applying a block copolymer over the DSA directing pattern; and etching the block polymer to form the DSA pattern.

2. The method of claim 1 further comprising adding the removed branch to a second photomask.

3. The method of claim 1 wherein the branch is a circuit line.

4. The method of claim 1 wherein the branch is a via or a via array.

5. The method of claim 1 wherein the design information is a design layout of the integrated circuit.

6. The method of claim 1 wherein the design information is data for a photomask.

7. A computer program product for mask decomposition and optimization for directed self assembly (DSA), the computer program product comprising a computer readable storage medium having program instructions executable by a computer processing device to cause the computer processing device to perform a method comprising:
  inputting design information of an integrated circuit that is to be patterned using a DSA process;
  mapping the design information into a tree graph comprising nodes and edges;
  searching the tree graph using a tree graph searching algorithm to identify a longest path through the tree graph;
  identifying a branch comprising an edge on the tree graph not on the longest path and stemming from one of the nodes on the longest path;
  outputting the one node on the longest path that connects to the branch as a hot spot;
  modifying a photomask by removing the branch from the photomask at the hot spot wherein removing the branch comprising separating the branch from the longest path and connecting the removed branch to a via, via array or line on an adjacent layer or a same layer; and
  further comprising applying a photoresist layer on a substrate of an integrated circuit;
  exposing the photoresist layer to the modified photomask in a lithographic process;
  developing and etching the exposed photoresist layer to form a DSA directing pattern;
  applying a block copolymer over the DSA directing pattern; and etching the block polymer to form the DSA pattern.

8. The computer program product of claim 7 further comprising adding the removed branch to a second photomask.

9. The computer program product of claim 7 wherein the branch is a circuit line.

10. The computer program product of claim 7 wherein the branch is a via or a via array.

11. The computer program product of claim 7 wherein the design information is a design layout of the integrated circuit.

12. The computer program product of claim 7 wherein the design information is data for a photomask.

13. An apparatus for mask decomposition and optimization for directed self assembly (DSA) comprising:
  a central processing unit;
  a storage;
  a design information of an integrated circuit that is to be patterned using a DSA process stored in the storage;
  a DSA mask converter system stored in the storage; and
  the central processing unit programmed with the DSA mask converter system to perform a method comprising:
  inputting design information of an integrated circuit that is to be patterned using a DSA process;
  mapping the design information into a tree graph comprising nodes and edges;
  searching the tree graph using a tree graph searching algorithm to identify a longest path through the tree graph;
  identifying a branch comprising an edge on the tree graph not on the longest path and stemming from one of the nodes on the longest path;
  outputting the node on the longest path that connects to the branch as a hot spot;
  modifying a photomask by removing the branch from the photomask at the hot spot wherein removing the branch comprising separating the branch from the longest path and connecting the removed branch to a via, via array or line on an adjacent layer or a same layer; and
  further comprising applying a photoresist layer on a substrate of an integrated circuit;
  exposing the photoresist layer to the modified photomask in a lithographic process;
  developing and etching the exposed photoresist layer to form a DSA directing pattern;
  applying a block copolymer over the DSA directing pattern; and etching the block polymer to form the DSA pattern.

14. The apparatus of claim 13 wherein the central processing unit is further programmed to perform adding the removed branch to a second photomask.

* * * * *